(12) United States Patent
Liu

(10) Patent No.: US 11,527,409 B2
(45) Date of Patent: Dec. 13, 2022

(54) CONTACT SLOTS FORMING METHOD APPLYING PHOTORESISTS

(71) Applicant: UNITED MICROELECTRONICS CORP., Hsin-Chu (TW)

(72) Inventor: Wei-Lin Liu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 282 days.

(21) Appl. No.: 17/016,425

(22) Filed: Sep. 10, 2020

(65) Prior Publication Data
US 2022/0076954 A1    Mar. 10, 2022

(51) Int. Cl.
*H01L 21/033*  (2006.01)
*H01L 21/8234*  (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/823437* (2013.01); *H01L 21/823475* (2013.01)

(58) Field of Classification Search
CPC ....... H01L 21/76816; H01L 21/823437; H01L 21/823475; H01L 23/485
See application file for complete search history.

(56) References Cited

U.S. PATENT DOCUMENTS 9,099,530 B2    8/2015  Lin
2010/0187658 A1*  7/2010  Wei .................. H01L 21/32139
                                                        257/E29.166

* cited by examiner

*Primary Examiner* — Walter H Swanson
(74) *Attorney, Agent, or Firm* — Winston Hsu

(57) ABSTRACT

Contact slots forming method applying photoresists include the following steps. A dielectric layer and a hard mask layer are formed on a substrate sequentially. A first patterned photoresist layer is formed over the hard mask layer, wherein the first patterned photoresist layer includes island patterns connecting to each other by connecting dummy parts. The hard mask layer is etched using the first patterned photoresist layer to form a patterned hard mask layer including island patterns connecting to each other by connecting dummy parts. A second patterned photoresist layer is formed over the patterned hard mask layer. The dielectric layer is etched using the second patterned photoresist layer and the patterned hard mask layer as a mask to form contact holes in the dielectric layer.

18 Claims, 5 Drawing Sheets

CONTACT SLOTS FORMING METHOD APPLYING PHOTORESISTS

BACKGROUND OF THE INVENTION

1. Field of the Invention

The present invention relates generally to contact slots forming method applying photoresists, and more specifically to contact slots forming method applying photoresists and using double patterning methods.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality. In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and the spacer as a mask. In order to incorporate the gate, the source, and the drain into the circuit, contact slots are often utilized for interconnection purposes.

SUMMARY OF THE INVENTION

The present invention provides contact slots forming method applying photoresists, which applies photoresist layers including island patterns connecting to each other by connecting dummy parts, to prevent the island patterns from peeling.

The present invention provides contact slots forming method applying photoresists including the following steps. A dielectric layer and a hard mask layer are formed on a substrate sequentially. A first patterned photoresist layer is formed over the hard mask layer, wherein the first patterned photoresist layer includes island patterns connecting to each other by connecting dummy parts. The hard mask layer is etched using the first patterned photoresist layer to form a patterned hard mask layer including island patterns connecting to each other by connecting dummy parts. A second patterned photoresist layer is formed over the patterned hard mask layer. The dielectric layer is etched using the second patterned photoresist layer and the patterned hard mask layer as a mask to form contact holes in the dielectric layer.

According to the above, the present invention provides contact slots forming method applying photoresists, which applies photoresist layers including island patterns connecting to each other by connecting dummy parts, to increase photoresist standing areas and thus prevent the island patterns from peeling. Furthermore, a patterned hard mask layer and a patterned photoresist layer can serve as a mask to pattern a dielectric layer for forming contact slots.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-5 schematically depict three-dimensional diagrams, top views and cross-sectional views of contact slots forming method applying photoresists according to an embodiment of the present invention. FIG. 1(a), FIG. 2(a), FIG. 3(a), FIG. 4(a) and FIG. 5(a) depict three-dimensional diagrams, FIG. 1(b), FIG. 2(b), FIG. 3(b) FIG. 4(b) and FIG. 5(b) depict top views of FIG. 1(a), FIG. 2(a), FIG. 3(a), FIG. 4(a) and FIG. 5(a) respectively, and FIG. 1(c), FIG. 2(c), FIG. 3(c), FIG. 4(c) and FIG. 5(c) depict cross-sectional views of FIG. 1(a), FIG. 2(a), FIG. 3(a), FIG. 4(a) and FIG. 5(a) along line AA' of FIG. 1(b), FIG. 2(b), FIG. 3(b) FIG. 4(b) and FIG. 5(b) respectively.

Figure 1:
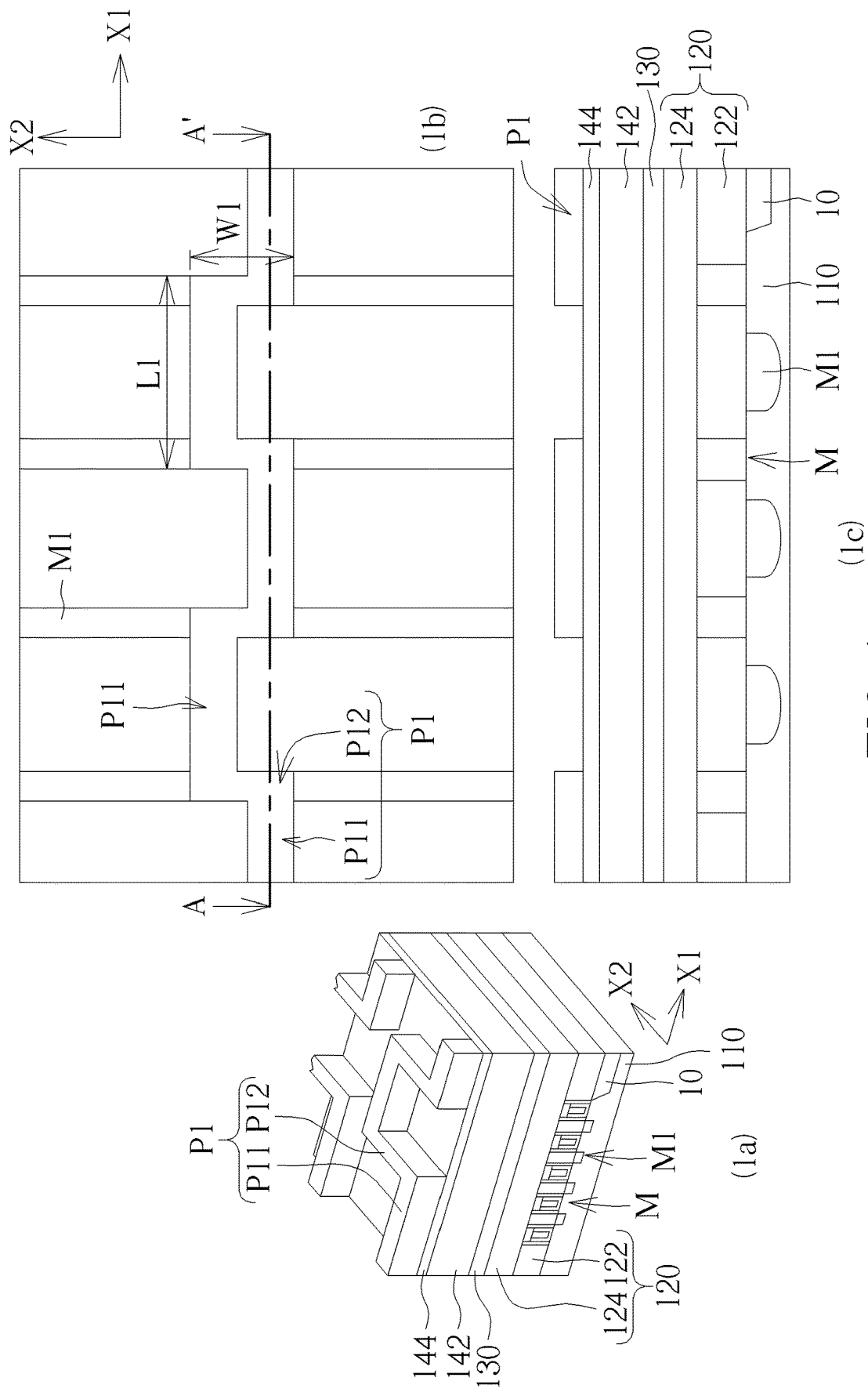
FIG. 1 schematically depicts a three-dimensional diagram, a top view and a cross-sectional view of contact slots forming method applying photoresists according to an embodiment of the present invention.

As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. An isolation structure 10 may be formed in the substrate 110 for electrically isolating transistors in different areas. The isolation structure 10 may be a shallow trench isolation (STI) structure, which may be formed by a shallow trench isolation (STI) process, but it is not limited thereto. Then, metal gates transistors are disposed on the substrate 110. That is, metal gates M are formed on the substrate 110 and doped regions M1 are doped in the substrate 110 beside the metal gates M. Methods of forming the metal gates M and the doped regions M1 are well known in the art, and are not described herein.

A dielectric layer 120 is formed on the substrate 110 and covers the metal gates M and the doped regions M1 blanketly. Preferably, the dielectric layer 120 is formed by forming an inter-dielectric layer 122 and a TEOS dielectric layer 124 sequentially. The inter-dielectric layer 122 and the TEOS dielectric layer 124 may be oxide layer formed by different kinds of processes, but it is not restricted thereto. More precisely, the inter-dielectric layer 122 is formed on the substrate 110 after dummy gates (not shown) are formed on the substrate 110 and the doped regions M1 beside the dummy gates are doped in the substrate 110, the dummy gates are removed thereby the inter-dielectric layer 122 having recess (not shown) therein, and then the metal gates M fill into the recesses in the inter-dielectric layer 122. Thereafter, the TEOS dielectric layer 124 covers the metal gates M and the inter-dielectric layer 122.

A hard mask layer 130 is formed on the dielectric layer 120. In this embodiment, the hard mask layer 130 includes a titanium nitride layer, which may have a thickness of 200~450 angstroms, but it is not limited thereto. An optional organic dielectric layer (ODL) 142 and an optional silicon-containing hard mask bottom anti-reflection coating (SHB) layer 144 may be formed on the hard mask layer 130 sequentially, wherein the optional organic dielectric layer (ODL) 142 may have a thickness of 1000~2000 angstroms while the optional silicon-containing hard mask bottom anti-reflection coating (SHB) layer 144 may have a thickness of 200~400 angstroms.

Then, a first patterned photoresist layer P1 is formed over the hard mask layer 130. In the present invention, the first patterned photoresist layer P1 includes island patterns P11 connecting to each other by connecting dummy parts P12. Each of the island patterns P11 may have a rectangular shape at a top view, wherein the rectangular shape has a length L1 along a first direction X1 and a width W1 along a second direction X2, wherein the length L1 is larger than the width W1. The connecting dummy parts P12 are applied in the present invention for preventing the island patterns P11 from peeling caused by the small standing area of each of the island patterns P11. Preferably, the island patterns P11 and the connecting dummy parts P12 are merged as snake shape patterns to increase photoresist standing areas.

Figure 2:
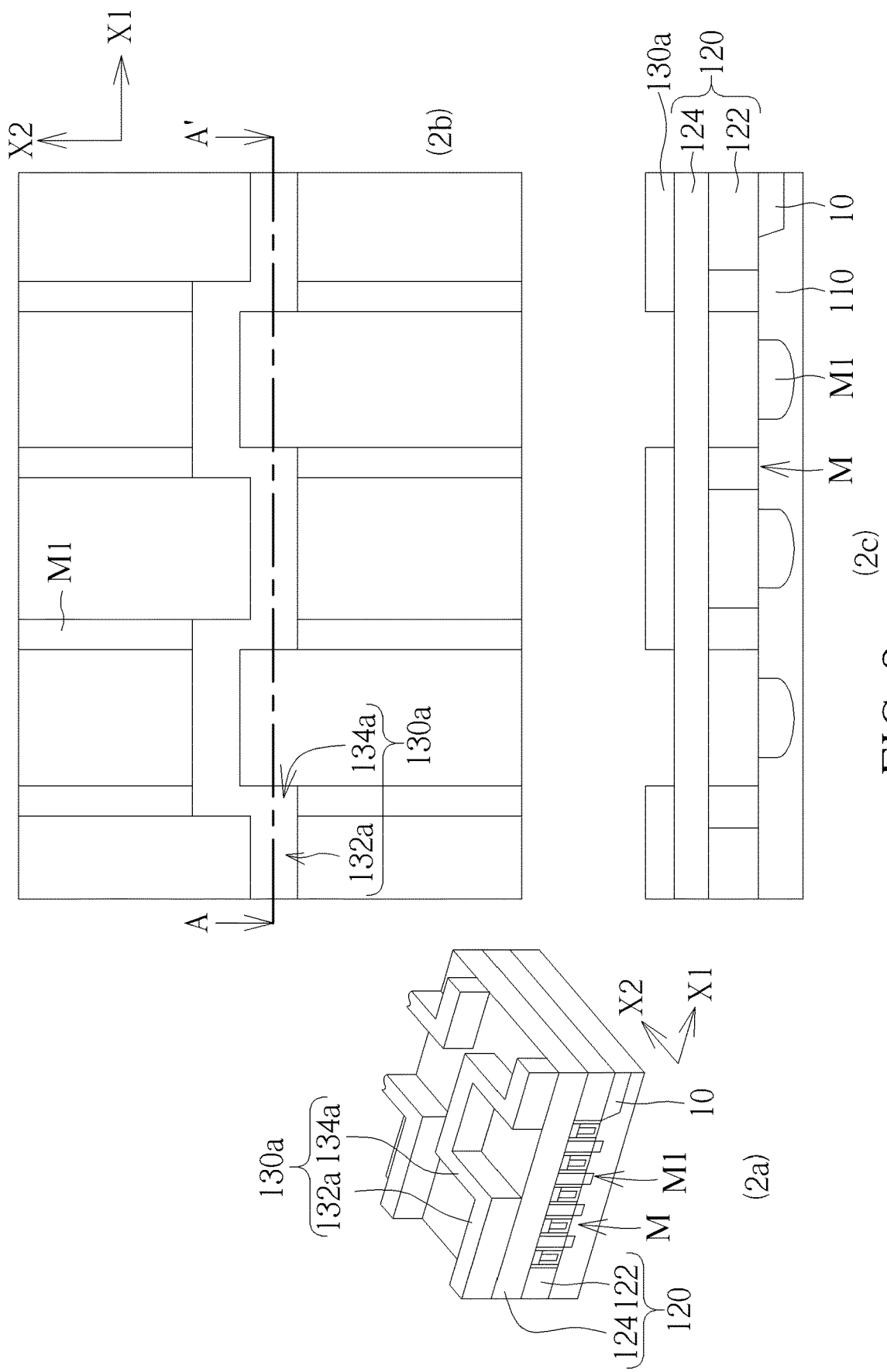
FIG. 2 schematically depicts a three-dimensional diagram, a top view and a cross-sectional view of contact slots forming method applying photoresists according to an embodiment of the present invention.

The hard mask layer 130 is then etched using the first patterned photoresist layer P1 to form a patterned hard mask layer 130a including island patterns 132a connecting to each other by connecting dummy parts 134a, as shown in FIG. 2. In this case, the patterned hard mask layer 130a including the island patterns 132a and the connecting dummy parts 134a are formed by transferring patterns of the first patterned photoresist layer P1, the silicon-containing hard mask bottom anti-reflection coating (SHB) layer 144 and the organic dielectric layer (ODL) 142 to the hard mask layer 130.

Figure 3:
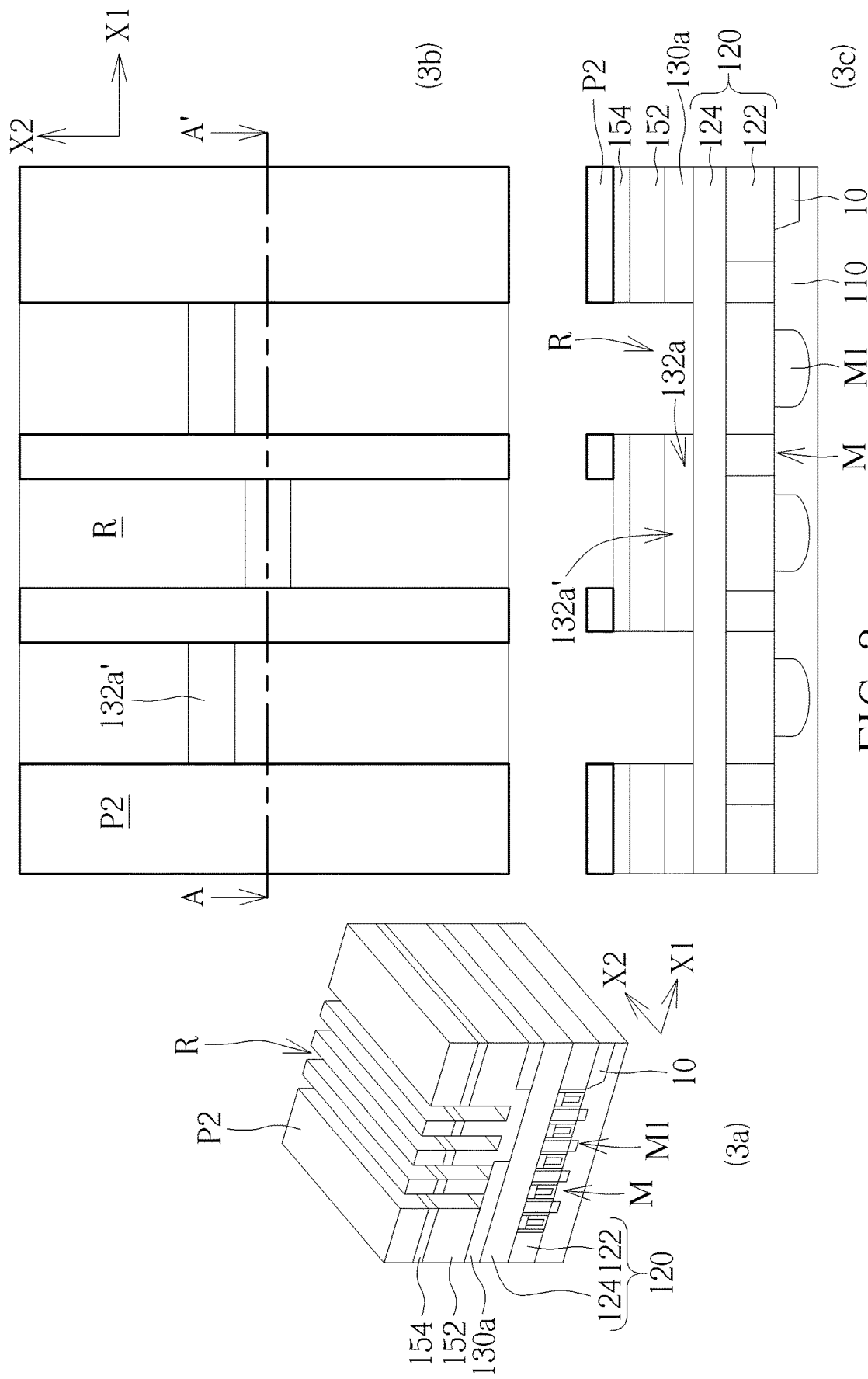
FIG. 3 schematically depicts a three-dimensional diagram, a top view and a cross-sectional view of contact slots forming method applying photoresists according to an embodiment of the present invention.

As shown in FIG. 3, an optional organic dielectric layer (ODL) 152 and an optional silicon-containing hard mask bottom anti-reflection coating (SHB) layer 154 may be formed on the patterned hard mask layer 130a sequentially, wherein the optional organic dielectric layer (ODL) 152 may have a thickness of 1000~2000 angstroms while the optional silicon-containing hard mask bottom anti-reflection coating (SHB) layer 154 may have a thickness of 200~400 angstroms.

Then, a second patterned photoresist layer P2 is formed over the patterned hard mask layer 130a. In the present invention, the second patterned photoresist layer P2 may include trenches R oriented in the second direction X2 and thus expose parts 132a' of the island patterns 132a of the patterned hard mask layer 130a. Since the trenches R are used for forming contact slots, the metal gates M and the trenches R are both oriented in the second direction X2 in this embodiment.

Figure 4:
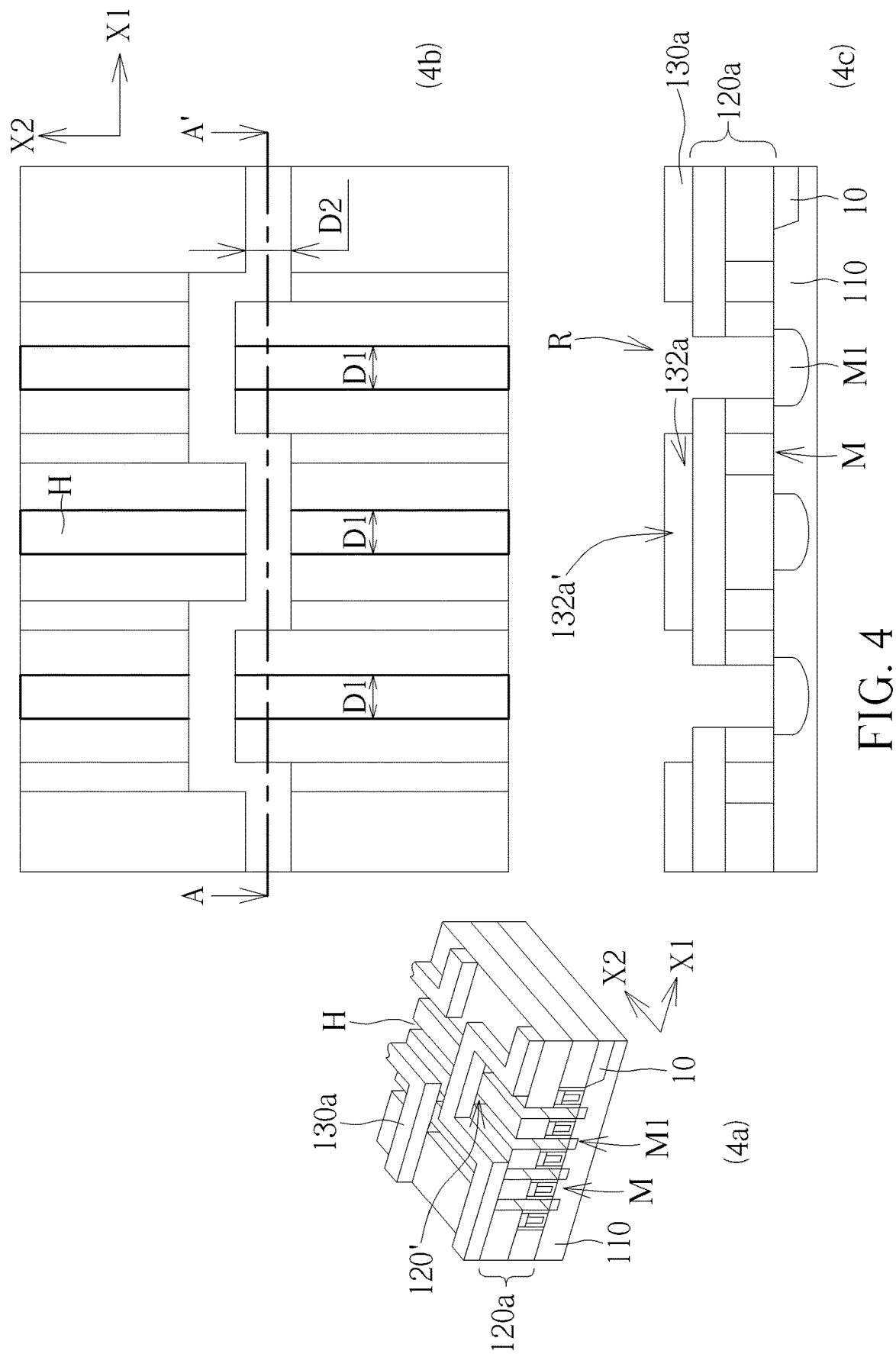
FIG. 4 schematically depicts a three-dimensional diagram, a top view and a cross-sectional view of contact slots forming method applying photoresists according to an embodiment of the present invention.

Therefore, the dielectric layer 120 can be etched using the second patterned photoresist layer P2 and the patterned hard mask layer 130a as a mask to form contact holes H in a dielectric layer 120a and expose the doped regions M1 in the substrate 110, as shown in FIGS. 3-4. In this embodiment, the contact holes H are precisely formed by a double patterning method. More precisely, the dielectric layer 120 are etched by transferring patterns of the second patterned photoresist layer P2, the silicon-containing hard mask bottom anti-reflection coating (SHB) layer 154 and the organic dielectric layer (ODL) 152 into the dielectric layer 120 except for parts 120' of the dielectric layer 120 covered by the patterned hard mask layer 130a. This means the parts 120' of the dielectric layer 120 covered by the exposed parts 132a' of the island patterns 132a of the patterned hard mask layer 130a are preserved.

In this embodiment, the second patterned photoresist layer P2, the silicon-containing hard mask bottom anti-reflection coating (SHB) layer 154 and the organic dielectric layer (ODL) 152 are removed while the dielectric layer 120 is etched. In a preferred embodiment, the contact holes H expose an active area D1 while the island patterns 132a of the patterned hard mask layer 130a preserve an non-contact area D2 for forming contact slots.

Figure 5:
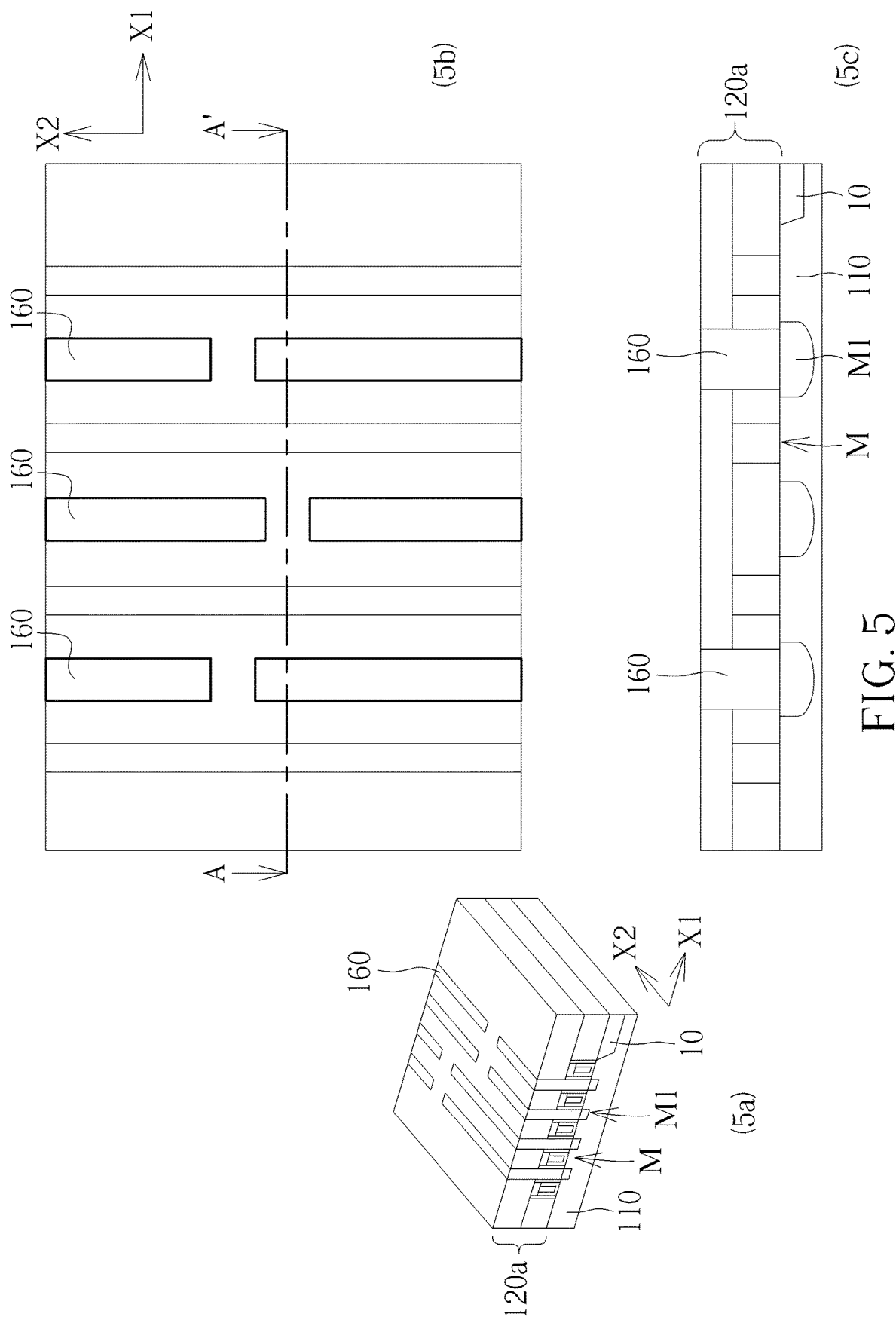
FIG. 5 schematically depicts a three-dimensional diagram, a top view and a cross-sectional view of contact slots forming method applying photoresists according to an embodiment of the present invention.

As shown in FIGS. 4-5, contact slots 160 fill in the contact holes H, and the patterned hard mask layer 130a is removed completely. Methods of filling the contact slots 160 and removing the patterned hard mask layer 130a are presented as follows, but they are not restricted thereto. In one case, a low resistivity material (not shown) blanketly fills in the contact holes H and covers the dielectric layer 120a and the patterned hard mask layer 130a, and then the low resistivity material (not shown) exceeding from the contact holes H and the patterned hard mask layer 130a is removed by planarizing. In another case, the patterned hard mask layer 130a is removed completely, and then the contact slots 160 fill in the contact holes H.

To summarize, the present invention provides contact slots forming method applying photoresists, which applies photoresist layers including island patterns connecting to each other by connecting dummy parts, to increase photoresist standing areas and thus prevent the island patterns from peeling. Moreover, a dielectric layer is formed on metal gates, and a hard mask layer is utilized to cover the dielectric layer. Then, a first patterned photoresist layer is used to pattern the hard mask layer, and then a second patterned photoresist layer and the patterned hard mask layer serve as a mask to pattern the dielectric layer to form contact slots. Since the first patterned photoresist layer includes the island patterns connecting to each other by the connecting dummy parts, the patterned hard mask layer also includes the island patterns connecting to each other by the connecting dummy parts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. Contact slots forming method applying photoresists, comprising:
   sequentially forming a dielectric layer and a hard mask layer on a substrate;
   forming a first patterned photoresist layer over the hard mask layer, wherein the first patterned photoresist layer comprises island patterns connecting to each other by connecting dummy parts;
   etching the hard mask layer using the first patterned photoresist layer to form a patterned hard mask layer comprising island patterns connecting to each other by connecting dummy parts;
   forming a second patterned photoresist layer over the patterned hard mask layer; and
   etching the dielectric layer using the second patterned photoresist layer and the patterned hard mask layer as a mask to form contact holes in the dielectric layer.

2. The contact slots forming method applying photoresists according to claim 1, wherein the hard mask layer comprises a titanium nitride layer.

3. The contact slots forming method applying photoresists according to claim 1, further comprising:
forming an organic dielectric layer (ODL) and a silicon-containing hard mask bottom anti-reflection coating (SHB) layer between the hard mask layer and the first patterned photoresist layer, so that the patterned hard mask layer is formed by transferring patterns of the first patterned photoresist layer, the silicon-containing hard mask bottom anti-reflection coating (SHB) layer and the organic dielectric layer (ODL).

4. The contact slots forming method applying photoresists according to claim 1, wherein each of the island patterns of the patterned hard mask layer comprises a rectangular shape at a top view.

5. The contact slots forming method applying photoresists according to claim 4, wherein the rectangular shape has a length along a first direction and a width along a second direction, wherein the length is larger than the width.

6. The contact slots forming method applying photoresists according to claim 5, wherein the second patterned photoresist layer comprises trenches oriented in the second direction.

7. The contact slots forming method applying photoresists according to claim 6, wherein the step of forming the dielectric layer comprises forming an inter-dielectric layer and a TEOS dielectric layer sequentially.

8. The contact slots forming method applying photoresists according to claim 7, further comprising:
filling metal gates into the inter-dielectric layer, and then forming the TEOS dielectric layer covering the metal gates and the inter-dielectric layer.

9. The contact slots forming method applying photoresists according to claim 8, wherein the metal gates are oriented in the second direction.

10. The contact slots forming method applying photoresists according to claim 1, wherein the contact holes expose doped regions in the substrate.

11. The contact slots forming method applying photoresists according to claim 1, wherein the contact holes expose an active area while the island patterns of the patterned hard mask layer preserve a non-contact area.

12. The contact slots forming method applying photoresists according to claim 1, wherein the contact holes are formed by a double patterning method.

13. The contact slots forming method applying photoresists according to claim 1, wherein the second patterned photoresist layer is removed while etching the dielectric layer.

14. The contact slots forming method applying photoresists according to claim 1, further comprising:
filling contact slots in the contact holes.

15. The contact slots forming method applying photoresists according to claim 14, further comprising:
removing the patterned hard mask layer completely.

16. The contact slots forming method applying photoresists according to claim 15, the steps of filling the contact slots in the contact holes and removing the patterned hard mask layer completely comprise:
blanketly filling a low resistivity material in the contact holes and covering the dielectric layer and the patterned hard mask layer; and
removing the low resistivity material exceeding from the contact holes and the patterned hard mask layer by planarizing.

17. The contact slots forming method applying photoresists according to claim 15, the steps of filling the contact slots in the contact holes and removing the patterned hard mask layer completely comprise:
removing the patterned hard mask layer completely, and then filling the contact slots in the contact holes.

18. The contact slots forming method applying photoresists according to claim 1, wherein the island patterns and the connecting dummy parts of the first patterned photoresist layer, and the island patterns and the connecting dummy parts of the patterned hard mask layer are merged as snake shape patterns.

* * * * *